United States Patent
Park et al.

(10) Patent No.: US 10,714,352 B2
(45) Date of Patent: Jul. 14, 2020

(54) APPARATUS AND METHOD FOR TREATING SUBSTRATE

(71) Applicant: SEMES CO., LTD., Chungcheongnam-do (KR)

(72) Inventors: Min Jung Park, Daegu (KR); Jung Yul Lee, Chungcheongbuk-do (KR); Hyun Hee Lee, Chungcheongnam-do (KR); Soo Hyun Cho, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/681,347

(22) Filed: Aug. 19, 2017

(65) Prior Publication Data
US 2018/0061649 A1 Mar. 1, 2018

(30) Foreign Application Priority Data
Aug. 31, 2016 (KR) .......................... 10-2016-0111428

(51) Int. Cl.
*H01L 21/302* (2006.01)
*H01L 21/027* (2006.01)
(Continued)

(52) U.S. Cl.
CPC .............. *H01L 21/302* (2013.01); *F26B 5/04* (2013.01); *H01L 21/0271* (2013.01); *H01L 21/02282* (2013.01); *H01L 21/02307* (2013.01); *H01L 21/02623* (2013.01); *H01L 21/30604* (2013.01); *H01L 21/31116* (2013.01); *H01L 21/6708* (2013.01); *H01L 21/6715* (2013.01); *H01L 21/67017* (2013.01); *H01L 21/6719* (2013.01); *H01L 21/67075* (2013.01); *H01L 21/67103* (2013.01); *H01L 21/67109* (2013.01); *H01L 21/67126* (2013.01); *H01L 21/67253* (2013.01);
(Continued)

(58) Field of Classification Search
CPC ............... H01L 21/302; H01L 21/0271; H01L 21/6719; H01L 21/6715; H01L 21/67109; H01L 21/67103; H01L 21/6708; H01L 21/02282; H01L 21/68742; H01L 21/683; H01L 21/67075; H01L 21/31116; H01L 21/67253; H01L 2021/60187; F26B 5/04
See application file for complete search history.

(56) References Cited

U.S. PATENT DOCUMENTS

| | | | |
|---|---|---|---|
| 6,010,963 A * | 1/2000 | Allman | ............ H01L 21/76819 257/E21.244 |
| 2008/0176410 A1* | 7/2008 | Muramatsu | ......... H01L 21/6715 438/758 |

(Continued)

FOREIGN PATENT DOCUMENTS

| | | |
|---|---|---|
| JP | 10-2007-0055387 A | 5/2007 |
| JP | 2015-126194 A | 7/2015 |
| JP | 2015126194 A * | 7/2015 |
| JP | 2016-115693 A | 6/2016 |
| KR | 1020160004209 A | 1/2016 |
| KR | 1020160017778 A | 2/2016 |
| KR | 1016234120000 B1 | 5/2016 |
| KR | 1020160057036 A | 5/2016 |

*Primary Examiner* — Anita K Alanko
(74) *Attorney, Agent, or Firm* — Li & Cai Intellectual Property (USA) Office

(57) ABSTRACT

Disclosed are an apparatus and a method for treating a substrate. The method includes repeatedly rotating the substrate alternately at a first speed and at a second speed while the treatment liquid is supplied, and the second speed is higher than the first speed.

12 Claims, 9 Drawing Sheets

(51) Int. Cl.
*H01L 21/67* (2006.01)
*H01L 21/687* (2006.01)
*F26B 5/04* (2006.01)
*H01L 21/02* (2006.01)
*H01L 21/311* (2006.01)
*H01L 21/683* (2006.01)
*H01L 21/60* (2006.01)
*H01L 21/306* (2006.01)

(52) U.S. Cl.
CPC ...... *H01L 21/683* (2013.01); *H01L 21/68742* (2013.01); *H01L 21/68764* (2013.01); *H01L 21/68792* (2013.01); *H01L 2021/60187* (2013.01)

(56) References Cited

U.S. PATENT DOCUMENTS

| | | | |
|---|---|---|---|
| 2011/0030897 A1* | 2/2011 | Terada | H01L 21/31055 156/345.21 |
| 2011/0052807 A1* | 3/2011 | Ichino | G03F 7/162 427/240 |
| 2012/0021611 A1* | 1/2012 | Yoshihara | H01L 21/6715 438/782 |
| 2015/0060407 A1* | 3/2015 | Negoro | C11D 3/0052 216/92 |

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2016-0111428 filed on Aug. 31, 2016, in the Korean Intellectual Property Office, the entire contents of which are hereby incorporated by reference.

BACKGROUND

Embodiments of the inventive concept described herein relate to an apparatus and a method for treating a substrate.

Various processes such as cleaning, deposition, photographing, etching, and ion implantation are performed to manufacture a semiconductor device. Among the processes, deposition and a spin-on hard (SOH) mask (hereinafter, coating) process are used as a process of forming a film on a substrate. Further, the etching process includes a dry etching method that uses plasma in a vacuum state, and a wet etching method that uses a liquid chemical in a normal pressure state.

In general, the deposition process is a process of forming a film on a substrate by depositing a process gas on the substrate, and the coating process is a process of forming a liquid film by supplying a treatment liquid to the center of the substrate.

The process of supplying a treatment liquid, such as the coating process or the wet etching process is generally performed by supplying the treatment liquid to the substrate that rotates at a specific speed. In this case, in order to coat the treatment liquid to the entire surface of the substrate and to provide a sufficient treatment rate, the treatment liquid of a specific amount or more is supplied.

SUMMARY

Embodiments of the inventive concept provide an apparatus and a method for increasing treatment efficiency.

Embodiments of the inventive concept also provide an apparatus and a method for reducing an amount of used treatment liquid.

The objects of the inventive concept are not limited to the above-described ones. Other technical objects that are not mentioned will be clearly understood from the following description by those skilled in the art to which the inventive concept pertains.

The inventive concept provides a method for treating a substrate by supplying a treatment liquid onto a substrate. The method may include repeatedly rotating the substrate alternately at a first speed and at a second speed while the treatment liquid is supplied, and the second speed may be higher than the first speed.

The rotational speed of the substrate may be changed between the first speed and the second speed two times or more.

An initial rotational speed of the substrate is the first speed or the second speed.

A rotational acceleration of the substrate may be constant or changed while the rotational speed of the substrate is changed between the first speed and the second speed.

The first speed may be 100 rpm or lower and the second speed may be 1000 rpm or higher.

The first speed may be 0 rpm.

The treatment liquid may be a chemical for etching a film coated on the substrate.

The treatment liquid may include thinner.

A time period for which the treatment liquid is supplied may be 100 seconds or less.

Unlike this, a method for treating a substrate may include a first coating process of forming a first coating layer by supplying a first coating liquid onto the substrate having a pattern, in a first chamber, an etching process of removing the first coating layer located on an upper surface of the pattern such that the upper surface of the pattern is exposed, by supplying a chemical onto the substrate, and a second coating process of forming a second coating layer by supplying a second coating liquid onto the substrate having a pattern, in a second chamber, the first coating process, the etching process, and the second coating process may be sequentially performed, in the etching process, the substrate may be repeatedly rotated alternately at a first speed and at a second speed while the chemical is supplied, and the second speed may be higher than the first speed.

The rotational speed of the substrate may be changed between the first speed and the second speed two times or more.

An initial rotational speed of the substrate may be the first speed or the second speed.

A rotational acceleration of the substrate may be constant or changed while the rotational speed of the substrate is changed between the first speed and the second speed.

The etching process may be performed in one of the first chamber or the second chamber.

Further, the inventive concept provides a substrate treating apparatus. The substrate treating apparatus may include a substrate support member supporting the substrate, a rotation driving member configured to rotate the substrate support member, a liquid supplying unit configured to supply a treatment liquid onto the substrate supported by the substrate support member, and a controller configured to control the rotation driving member and the liquid supplying unit, the controller may control the rotation driving member and the liquid supply unit such that the substrate is repeatedly rotated alternately at a first speed and at a second speed while the treatment liquid is supplied, and the second speed may be higher than the first speed.

The controller may control the rotation driving member such that the rotational speed of the substrate is changed between the first speed and the second speed two times or more.

The controller may control the rotation driving member such that an initial rotational speed of the substrate is the first speed or the second speed.

The controller may control the rotation driving member such that a rotational acceleration of the substrate is constant or changed while the rotational speed of the substrate is changed between the first speed and the second speed.

The first speed may be 100 rpm or lower and the second speed may be 1000 rpm or higher.

The treatment liquid may be a chemical for etching a film coated on the substrate.

The treatment liquid may include thinner.

The liquid supply unit may include an coating unit configured to supply an coating liquid onto the substrate having a pattern.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

The system of the present embodiment is used to perform a process of forming a liquid film by supplying a treatment liquid to a substrate, such as a semiconductor wafer or a flat display panel. In particular, the system of the present embodiment is used to perform a process of forming a liquid by rotating a substrate and supplying a treatment liquid to the center of the substrate. Hereinafter, it will be exemplified that a wafer is used as a substrate. However, the substrate may be various types of substrates, such as a flat display panel and a photo mask, in addition to a semiconductor wafer. Unlike this, the substrate treating apparatus according to embodiments of the inventive concept may be applied to various systems for treating a substrate by supplying a liquid to the substrate.

Figure 1:
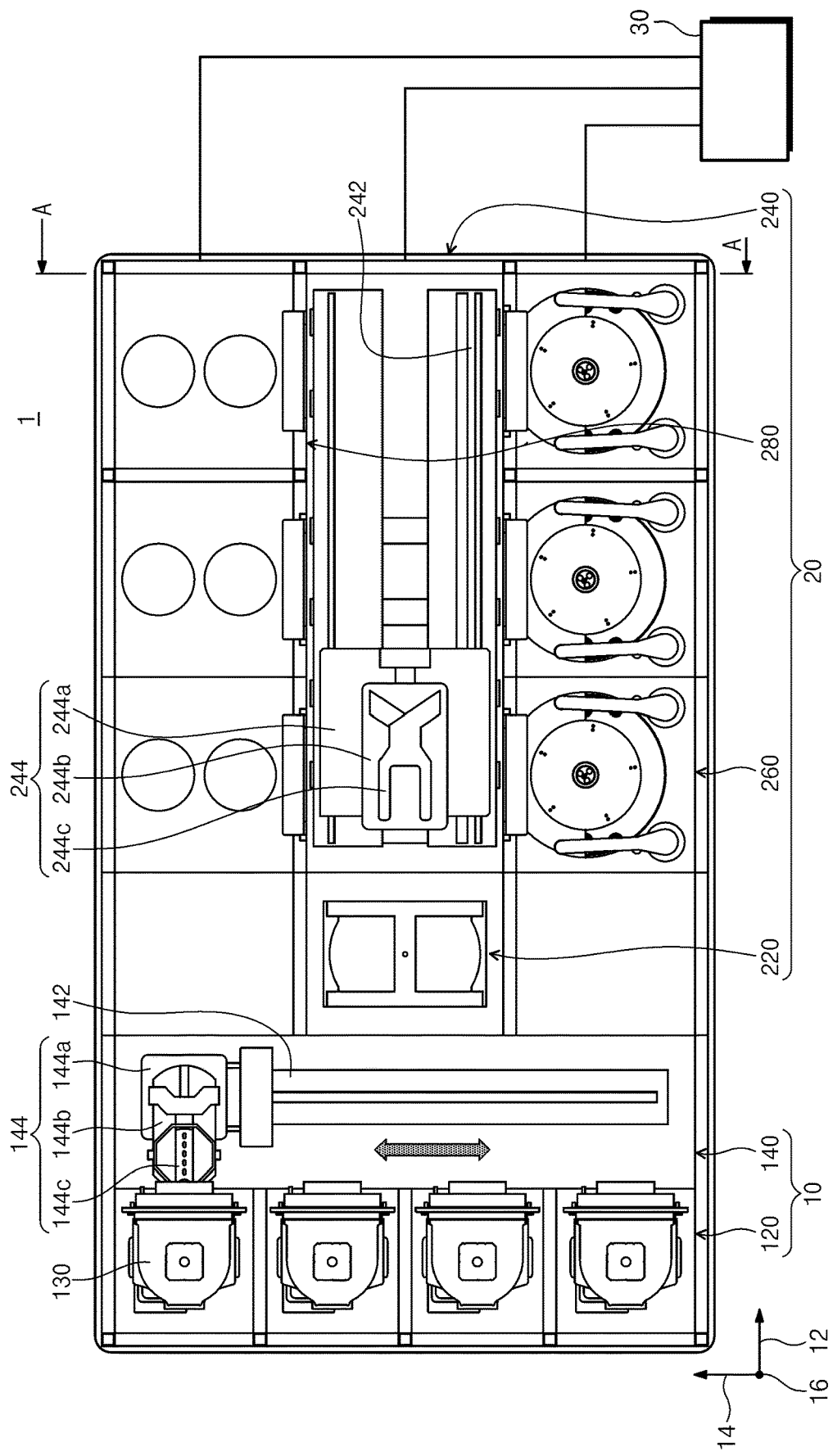
FIG. 1 is a sectional view illustrating a substrate treating system according to an embodiment of the inventive concept.
Figure 2:
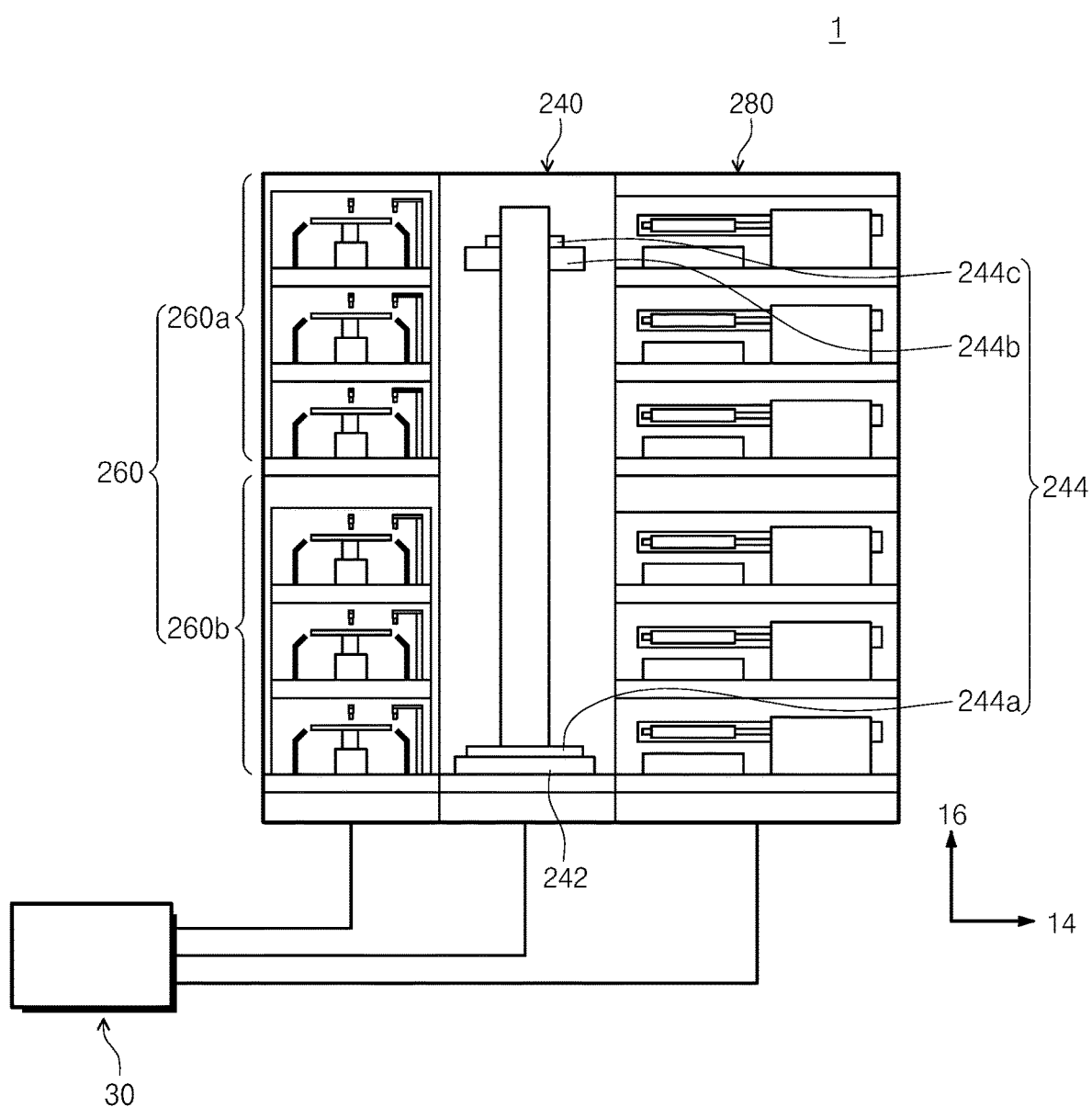
FIG. 2 is a sectional view of the substrate treating system of FIG. 1, taken along line A-A of FIG. 1.

FIG. 1 is a plan view illustrating a substrate treating system according to an embodiment of the inventive concept. FIG. 2 is a view of the substrate treating system of FIG. 1, taken along line A-A of FIG. 1. Referring to FIGS. 1 and 2, the substrate treating system 1 includes an index module 10, a process executing module 20, and a controller 30. The index module 10 includes a plurality of load ports 120 and a feeding frame 140. The load ports 120, the feeding frame 140, and the process executing module 20 may be sequentially arranged in a row. Hereinafter, a direction in which the load ports 120, the feeding frame 140, and the process executing module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18 provided to a container in which a substrate W is received is seated on the load port 120. A plurality of load ports 120 are provided, and are arranged along the second direction 14 in a row. However, the number of the load ports 120 may increase or decrease according to a condition, such as the process efficiency of the process executing module 20 or a footprint. A plurality of slots (not illustrated) for receiving substrates W while the substrates W are arranged in parallel to the ground surface are formed in the carrier 18. A front opening unified pod (FOUP) may be used as the carrier 18.

The process executing module 20 includes a buffer unit 220, a transfer chamber 240, and a plurality of process chambers 260 and 280. The process chamber includes liquid treatment chambers 260 and bake chambers 280. The transfer chamber 240 is disposed such that the lengthwise direction thereof is in parallel to the first direction 12. The liquid treatment chambers 260 are disposed on one side of the transfer chamber 240, and the bake chambers 280 are disposed on an opposite side of the transfer chamber 240. The liquid treatment chambers 260 and the bake chambers 280 may be provided to be symmetrical to each other with respect to the transfer chamber 240. A plurality of liquid treatment chambers 260 are provided on one side of the transfer chamber 240. Some of the liquid treatment chambers 260 are disposed along the lengthwise direction of the transfer chamber 240. Furthermore, some of the liquid treatment chambers 260 are disposed to be stacked on each other. That is, the liquid treatment chambers 260 having an array of A by B may be arranged on one side of the transfer chamber 240. Here, A is the number of the liquid treatment chambers 260 provided in a row along the first direction 12, and B is the number of the liquid treatment chambers 260 provided in a row along the third direction 16. When four or six liquid treatment chambers 260 are provided on one side of the transfer chamber 240, the liquid treatment chambers 260 may be arranged in an array of 2 by 2 or 3 by 2. The number of the liquid treatment chambers 260 may increase or decrease.

According to an embodiment, the liquid treatment chamber 260 includes first chambers 260a and second chambers 260b. In this case, a plurality of first chambers and a plurality of second chambers 260b may be arranged in the first direction 12. The first chambers 260a and the second chambers 260b may be stacked on each other, and the first chambers 260a may be provide on the second chambers 260b. Unlike this, selectively, the second chambers 260b may be provided on the first chambers 260a.

Unlike this, the liquid treatment chambers 260 may be provided on one side or opposite sides of the transfer chamber 240 to form a single layer. In this case, the first chambers 260a and the second chambers 260b may be provided at the same height.

A plurality of bake chambers 280 are provided on an opposite side of the transfer chamber 240. The number of the bake chambers 280 may be larger than the number of the liquid treatment chambers 260. Some of the bake chambers 280 are disposed along the lengthwise direction of the transfer chamber 240. Furthermore, some of the bake chambers 280 are disposed to be stacked on each other. That is, the bake chambers 280 having an array of C by D may be disposed on an opposite side of the transfer chamber 240. Here, C is the number of the bake chambers 280 provided in a row along the first direction 12, and D is the number of the bake chambers 280 provided in a row along the third direction 16. When four or six bake chambers 280 are provided on an opposite side of the transfer chamber 240, the bake chambers 280 may be arranged in an array of 2 by 2 or 3 by 2. The number of the bake chambers 280 may increase or decrease. According to an embodiment, when the first chambers 260a and the second chambers 260b are provided as in FIGS. 1 and 2, some of the bake chambers 280 are located from the first chambers 260a in the second direction and are arranged along the first direction. The others of the bake chambers 280 are located from the second chambers 260b in the second direction and are arranged along the first direction. Accordingly, the transfer chamber 240 is located between some of the bake chambers 280 and the first chambers 260a and between the others of the bake chambers 280 and the second chambers 260b. Unlike this, the bake chambers 280 may be provided in a single layer.

The buffer unit 220 is disposed between the feeding frame 140 and the transfer chamber 240. The buffer unit 220 provides a space in which the substrates W stay before being transported, between the transfer chamber 240 and the feeding frame 140. A plurality of slots (not illustrated) in which the substrates W are positioned are provided in the interior of the buffer unit 220. A plurality of slots (not illustrated) may be provided to be spaced apart from each other along the third direction 16. A face of the buffer unit 220 that faces the feeding frame 140 and a face of the buffer unit 220 that faces the transfer chamber 240 are opened.

An index rail 142 and an index robot 144 are provided in the feeding frame 140. The index rail 142 is arranged such that the lengthwise direction thereof is in parallel to the second direction 14. The index robot 144 transports the substrates W between the carrier 18 seated on the load port 120 and the buffer unit 220. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are disposed to be stacked so as to be spaced apart from each other along the third direction 16. Some of the index arms 144c are used when the substrates W are transported to the carrier 18 in the process module 20, and some of the index arms 144c may be used when the substrates W are transported from the carrier 18 to the process executing module 20. This structure may prevent particles generated from the substrates W before the process treatment from being attached to the substrates W after the process treatment in the process of carrying the substrates W in and out by the index robot 144.

A guide rail 242 and a main robot 244 are provided in the transfer chamber 240. The main robot 244 transfers the substrate W between any two of the buffer unit 220, the first chambers 260a, the second chambers 260b, and the bake chamber 280. The guide rail 242 is disposed such that the lengthwise direction thereof is parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16.

A film forming process of forming a film on the substrate W is performed in the liquid treatment chambers 260. Some of the liquid treatment chambers 260 may have the same structure and configuration. However, the liquid treatment chamber 260 may have different structures according to the types of the film forming process. Selectively, the liquid treatment chambers 260 may be classified into a plurality of groups, and the configurations and structures of the liquid treatment chambers 260 pertaining to the same group may be the same and the configurations and structures of the liquid treatment chambers 260 pertaining to the different groups may be the different.

According to an embodiment, the first chambers 260a perform a first coating process S10. The first coating process S10 is a process of forming a first coating layer 15 by supplying a first coating liquid onto the substrate W having a pattern 13. The second chambers 260b perform a second coating process S40. The second coating process S40 is a process of forming a second coating layer 17 by supplying a second coating liquid onto the substrate W having a pattern 13. For example, the first coating liquid and the second coating liquid may be a photosensitive liquid or a spin-on hard mask liquid, for example, of a photoresist (PR). The first coating liquid and the second coating liquid may be photoresist liquids having different compositions and/or composition ratios. Further, the first coating liquid and the second coating liquid may be spin-on hard mask liquids having different compositions and/or composition ratios.

An etching process S30 is performed in one of the first chamber 260a or the second chamber 260b. The etching process S30 is a process of removing the first coating layer 15 located on an upper surface of the pattern 13 such that the upper surface of the pattern 13 is exposed, by supplying a chemical to the substrate W on which the first coating process S10 has been performed. For example, the chemical may be thinner. Unlike this, the chemical may be various types of fluids that may etch the first coating layer 15 and the second coating layer 17.

The first coating process S10, the second coating process S40, and the etching process S30 may be performed at a normal pressure. The first coating process S10, the second coating process S40, and the etching process S30 may be performed by supplying the first coating liquid, the second coating liquid, or the chemical to the substrate W while the substrate W is rotated.

The details of the processes will be described together with the substrate treating method of the inventive concept with reference to FIGS. 8 to 13.

Figure 3:
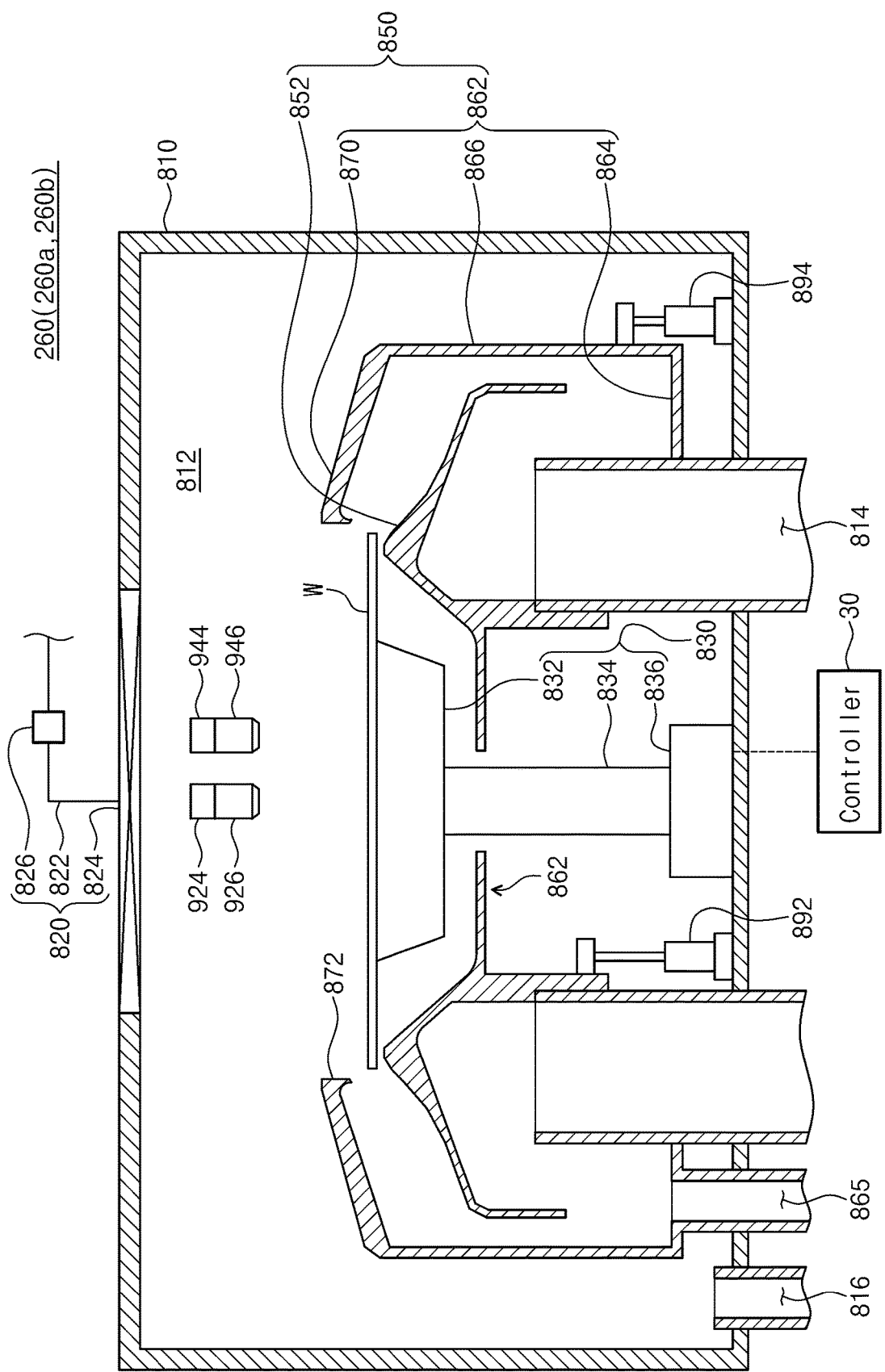
FIG. 3 is a sectional view of a liquid treatment chamber of FIG. 1, viewed from the front side.
Figure 4:
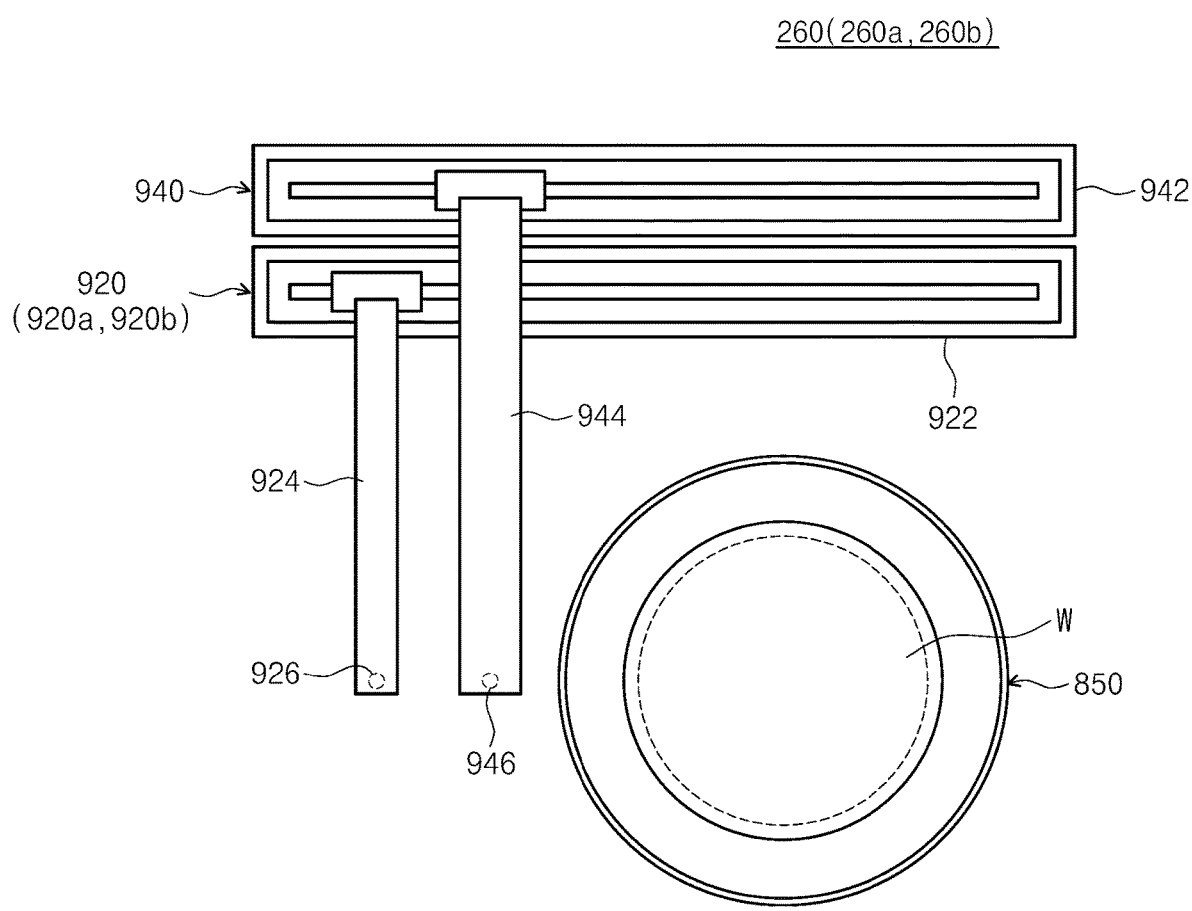
FIG. 4 is a plan view of the liquid treatment chamber of FIG. 3.

FIG. 3 is a sectional view of a liquid treatment chamber 260 of FIG. 1, viewed from the front side. FIG. 4 is a plan view of the liquid treatment chamber 260 of FIG. 3. The liquid treatment chamber 260 of FIG. 1 may include first chambers 260a and second chambers 260b. The configurations and structures of the first chambers 260a and the second chambers 260b may be the same except for the types of the coating liquids supplied from the coating units and existence of the etching unit 940. Referring FIGS. 3 and 4, the liquid treatment chamber 260 includes a housing 810, an air current providing unit 820, a substrate supporting unit 830, a treatment container 850, an elevation unit 890, an coating unit 920, and an etching unit 940.

The housing 810 has a rectangular tub shape having a space 812 in the interior thereof. An opening (not illustrated) is formed on one side of the housing 810. The opening functions as a port through which a substrate W is carried in and out. A door is installed in the opening, and the door opens and closes the opening. If a substrate treating process is performed, the door interrupts the opening and closes the interior space 812 of the housing 810. An inner outlet 814 and an outer outlet 816 are formed on the lower surface of the housing 810. The air in the housing 810 is exhausted to the outside through the inner outlet 814 and the outer outlet 816. According to an example, the air provided for the treatment container 850 may be exhausted through the inner outlet 814, and the air provided for the outside of the treatment container 850 may be exhausted through the outer outlet 816.

The air current providing unit 820 forms a descending air current in the interior space of the housing 810. The air current providing unit 820 includes an air current supply line 822, a fan 824, and a filter 826. The air current supply line 822 is connected to the housing 810. The air current supply line 822 supplies exterior air into the housing 810. The filter 826 filters air provided from the air current supply line 822. The filter 826 eliminates impurities contained in the air. The fan 824 is installed on the upper surface of the housing 810. The fan 824 is situated at a central area of the upper surface of the housing 810. The fan 824 forms a descending air current in the interior space of the housing 810. If the air is supplied from the air current supply line 822 to the fan 824, the fan 824 supplies the air downwards.

The substrate supporting unit 830 supports the substrate W in the interior space of the housing 810. The substrate supporting unit 830 rotates the substrate W. The substrate supporting unit 830 includes a spin chuck 832, and rotation driving members 834 and 836. The spin chuck 832 is provided for a substrate supporting member. The spin chuck 832 has a circular disk shape. The substrate W makes contact with the upper surface of the spin chuck 832. The spin chuck 832 has a diameter that is smaller than that of the substrate W. According to an example, the spin chuck 832 may vacuum-suction the substrate W and chuck the substrate W. Optionally, the spin chuck 832 may be provided for an electrostatic chuck that chucks the substrate W by using static electricity. The spin chuck 832 may chuck the substrate W by a physical force.

The rotation driving members 834 and 836 include a rotary shaft 348 and a driver 349. The rotary shaft 834 supports the spin chuck 832 under the spin chuck 832. The rotary shaft 834 is provided such that the lengthwise direction thereof faces the upper and low sides. The rotary shaft 834 is provided to be rotatable about the central axis thereof. The driver 836 provides a driving force such that the rotary shaft 834 is rotated. For example, the driver 836 may be a motor that varies the rotational speed of the rotary shaft.

The treatment container 850 is situated in the interior space 812 of the housing 810. The treatment container 850 has a treatment space in the interior thereof. The treatment container 850 has an open-topped cup shape. The treatment container 850 includes an inner cup 852 and an outer cup 862.

The inner cup 852 has a circular disk shape that surrounds the rotary shaft 834. The inner cup 852 is situated to overlap the inner outlet 814 when viewed from the top. The upper surface of the inner cup 852 is provided such that an outer area and an inner area thereof have different angles when viewed from the top. According to an example, the outer area of the inner cup 852 is downwardly inclined as it goes away from the substrate support unit 830 and the inner area of the inner cup 852 is upwardly inclined as it goes away from the substrate support unit 830. A point where the outer area and the inner area of the inner cup 852 meet is provided to vertically correspond to a side end of the substrate W. The outer area of the upper surface of the inner cup 852 is rounded. The outer area of the upper surface of the inner cup 852 is concave. An outer area of the upper surface of the inner cup 852 may be provided as an area in which the coating liquid supplied from the coating unit 920 and a treatment liquid such as a chemical supplied from the etching unit 940 flow.

The outer cup 862 has a cup shape that surrounds the substrate supporting unit 830 and the inner cup 852. The outer cup 862 has a bottom wall 864, a side wall 866, an upper wall, and an inclined wall 870. The bottom wall 864 has a hollow circular disk shape. A recovery line 865 is formed in the bottom wall 864. The recovery line 865 recovers a treatment liquid supplied onto the substrate W. The treatment liquid recovered by the recovery line 865 may be reused by an external liquid recycling system. The side wall 866 has a circular tub shape that surrounds the substrate supporting unit 830. The side wall 866 extends from a side end of the bottom wall 864 in a direction perpendicular to the bottom wall 864. The side wall 866 extends upwards from the bottom wall 864.

The inclined wall 870 extends from an upper end of the side wall 866 towards the inside of the outer cup 862. The inclined wall 870 is provided to become closer as it goes upwards. The inclined wall 870 has a ring shape. An upper end of the inclined wall 870 is higher than the substrate W supported by the substrate supporting unit 830.

The elevation unit 890 elevates the inner cup 852 and the outer cup 862. The elevation unit 890 includes an inner movable member 892 and an outer movable member 894. The inner movable member 892 elevates the inner cup 852, and the outer movable member 894 elevates the outer cup 862.

The coating unit 920 performs an coating process of forming a thin film. Here, the thin film is provided as a liquid film formed by a liquid. The coating unit 920 supplies an coating liquid to the substrate W. When the process chamber of FIG. 3 is the first chamber 260a, the coating unit 920 is provided as the first coating unit 920a. Unlike this, when the process chamber of FIG. 3 is the second chamber 260b, the coating unit 920 is provided as the second coating unit 920b. The first coating unit 920a performs the first coating process S10 by supplying the first coating liquid onto the substrate W. The second coating unit 920b performs the second coating process S40 by supplying the second coating liquid onto the substrate W. The coating unit 920 includes a guide member 922, an arm 924, and an coating nozzle 926. The guide member 922 and the arm 924 move the coating nozzle 926 to a process location and a standby location. Here, the process location is a location at which a discharge end of the coating nozzle 926 faces the center of the substrate W, and the standby location is defined as a location that deviates from the process location. The guide member 922 includes a guide rail 924 that moves the arm 922 horizontally. The guide rail 924 is located on one side of the treatment container 850. The guide rail 924 is provided such that the lengthwise direction thereof is horizontal. According to an example, the lengthwise direction of the guide rail 924 may be in a direction parallel to the first direction 12. The arm 922 is installed in the guide rail 924. The arm 924 may be moved by a linear motor provided in the interior of the guide rail 924. The arm 924 may face the lengthwise direction that is perpendicular to the guide rail 924 when viewed from the top. One end of the arm 924 is mounted on the guide rail 924. An coating nozzle 926 is installed on a bottom surface of an opposite end of the arm 924. Selectively, the arm 924 may be coupled to the rotary shaft 834, a lengthwise direction of which faces the third direction 16, to be rotated.

The etching unit 940 is provided as a liquid supply unit configured to perform an etching process by supplying a chemical to the substrate W. The etching unit 940 includes a guide member 942, an arm 944, and a chemical nozzle 946. The guide member 942 and the arm 944 of the etching unit 940 have the same shapes as those of the guide member 922 and the arm 924 of the coating unit 920. The guide member 942 and the arm 944 of the etching unit 940 may be driven independently from the coating unit 920. Accordingly, a detailed description of the guide member 942 and the arm 944 of the etching unit 940 will be omitted. The chemical nozzle 946 discharges the chemical onto the substrate W. The chemical nozzle 946 is fixedly coupled to the bottom surface of the arm 944. The coating unit 920, the etching unit 940, and the rotation driving members 834 and 836 are controlled by the controller 30. The etching unit 940 may be provided to one of the first chamber 260a or the second chamber 260b.

The bake chambers 280 have the same structure. Meanwhile, the bake chambers 280 may have different structures according to the type of the film forming process or the difference of the exhaust amounts due to the difference of the heights of the chambers 810. Selectively, the bake chambers 280 may be classified into a plurality of groups, and the substrate treating apparatuses provided to the bake chambers 280 pertaining to the same group may be the same and the substrate treating apparatuses provided to the bake chambers 280 pertaining to different groups may be different.

The bake chambers 280 perform heat treatment processes of heating the substrate W to a specific temperature, and may perform cooling processes of cooling the substrate W after the heat treatment processes.

Figure 5:
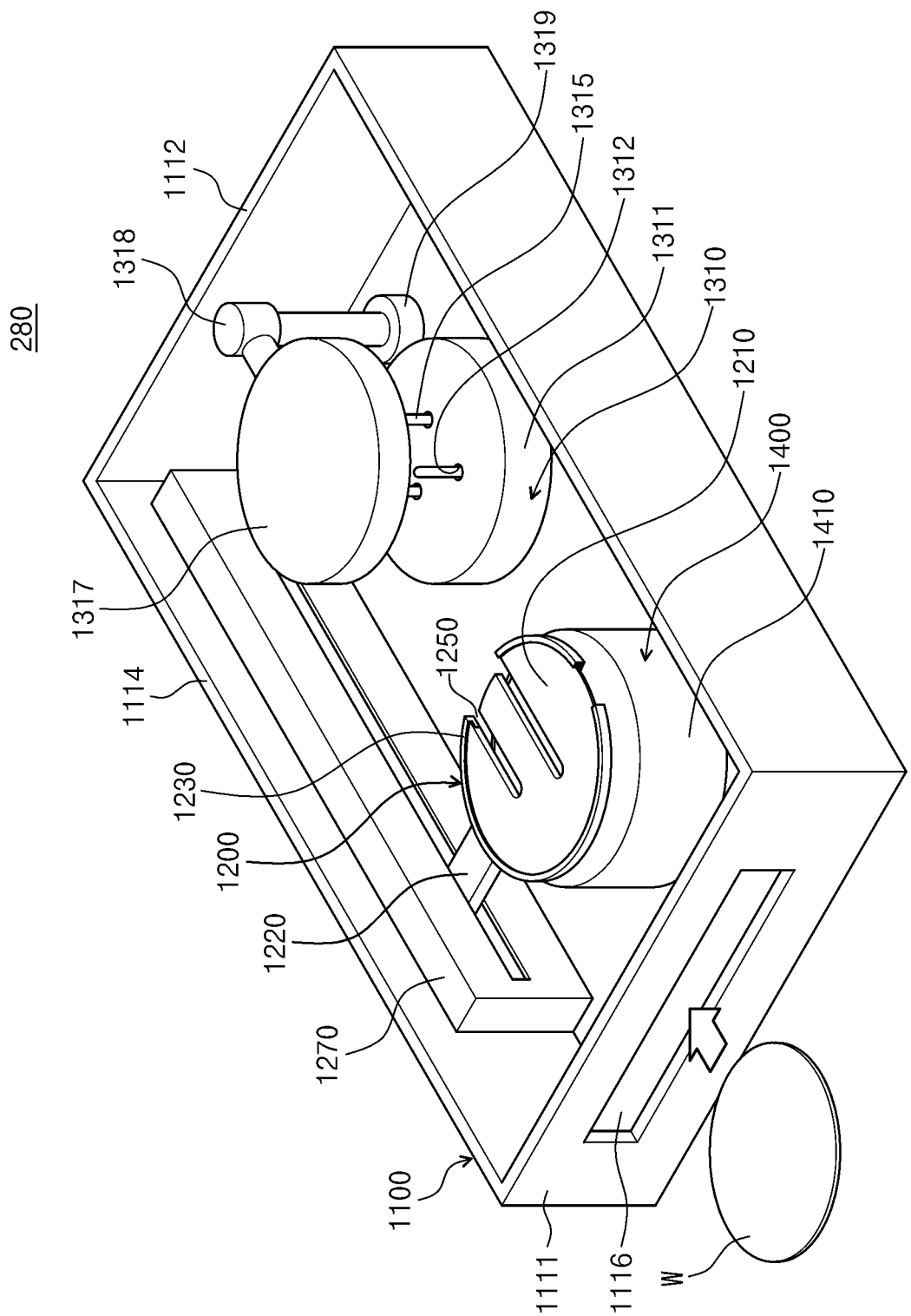
FIG. 5 is a perspective view illustrating a bake chamber of FIG. 1.
Figure 6:
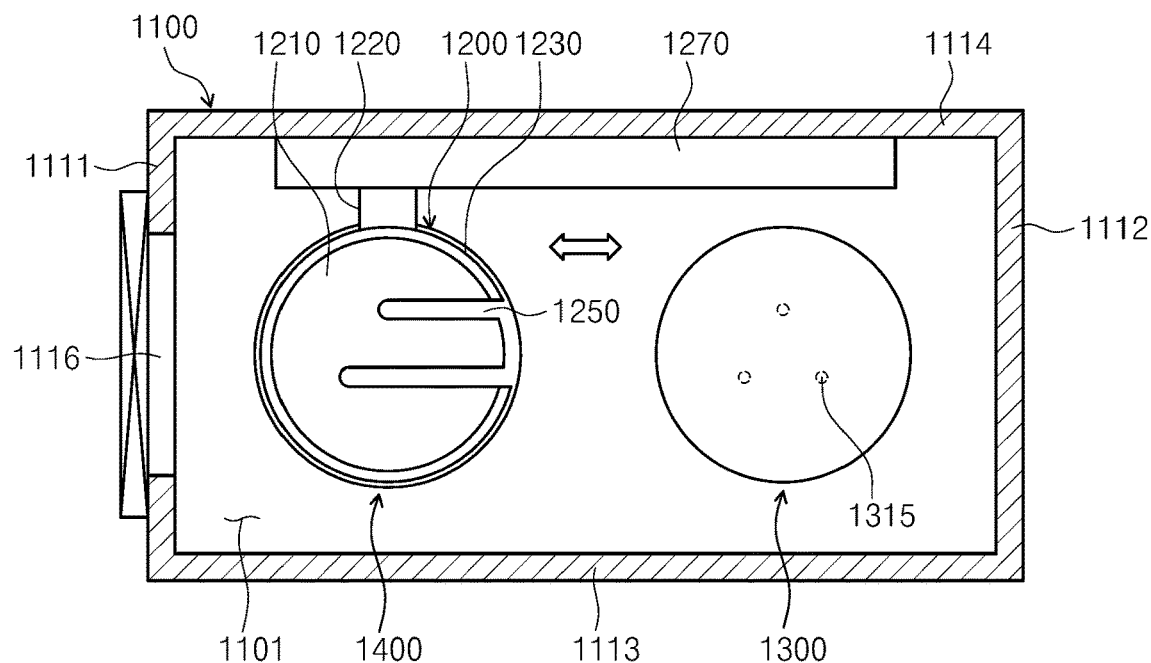
FIG. 6 is a plan view illustrating the bake chamber of FIG. 5.
Figure 7:
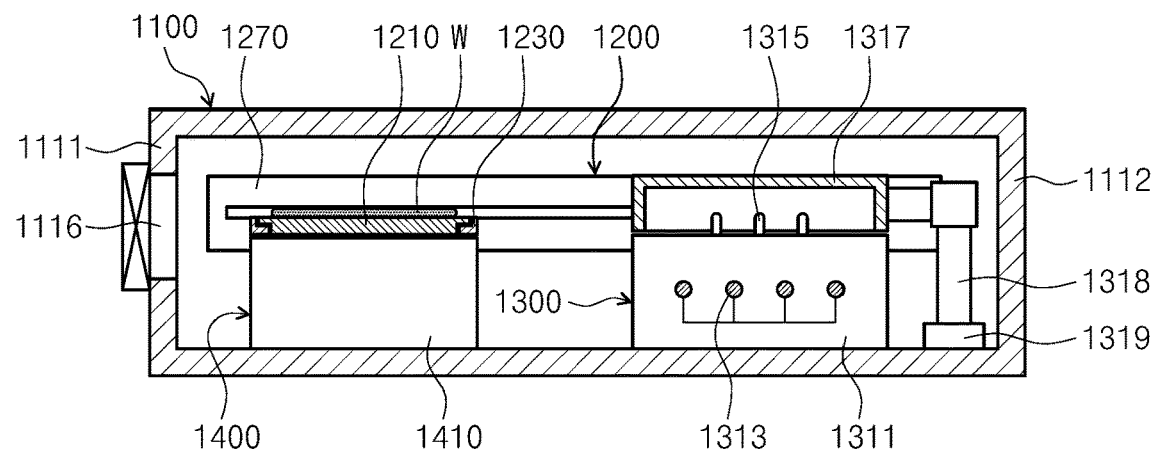
FIG. 7 is a sectional view illustrating the bake chamber of FIG. 5.

FIG. 5 is a perspective view illustrating a bake chamber 280 of FIG. 1. FIG. 6 is a plan view illustrating a bake chamber 280 of FIG. 5. FIG. 7 is a sectional view illustrating a bake chamber 280 of FIG. 5. Referring to FIGS. 5 to 7, the bake chamber 280 includes a housing 1100, a transfer unit 1200, a heating unit 1300, and a cooling unit 1400.

The housing 1100 provides a treatment space in the interior thereof such that, for example, a bake process is performed. The housing 1100 has a rectangular parallelepiped shape. The housing 1100 includes a first side wall 1111, a second side wall 1112, a third side wall 1113, and a fourth side wall 1114.

The first side wall 1111 is provided on one side surface of the housing 1100. The first side wall 1111 has an entrance 1116, through which the substrate W is introduced and discharged. The entrance 1116 provides a passage through which the substrate W moves.

The second side wall 1112 is formed on an opposite side of the first side wall 1111. The second side wall 1112 is provided in parallel to the first side wall 1111. The third side wall 1113 is provided between the first side wall 1111 and the second side wall 1112. The third side wall 1113 is provided to be perpendicular to the first side wall 1111 and the second side wall 1112. The fourth side wall 1114 is provided between the first side wall 1111 and the second side wall 111.

The fourth side wall 1114 is provided to be perpendicular to the first side wall 1111 and the third side wall 1113. The fourth side wall 1114 is provided in parallel to the third side wall 1113.

The transfer unit 1200 moves the substrate W between the heating unit 1300 and the cooling unit 1400 in the housing 1100. The transfer unit 1200 includes a transfer plate 1210, a support arm 1220, a support ring 1230, and a driving member 1270.

The substrate W is positioned on the transfer plate 1210. The transfer plate 1210 has a circular shape. The transfer plate 1210 has the same size as that of the substrate W. The transfer plate 1210 is formed of a metallic material of an excellent thermal conductivity. A guide hole 1250 is formed in the transfer plate 1210. The guide hole 1250 is a space for accommodating a lift pin 1315. The guide hole 1250 extends from the outside to the inside of the transfer plate 1210. The guide hole 1250 prevents the transfer plate 1210 from interfering or colliding with the lift pin 1315 when the transfer plate 1210 is moved.

The support arm 1220 is fixedly coupled to the transfer plate 1210. The support arm 1220 is provided between the transfer plate 1210 and the driving member 1270.

The support ring 1230 is provided to surround the transfer plate 1210. The support ring 1230 supports a periphery of the transfer plate 1210. The support ring 1230 functions to support the substrate W such that the substrate W is positioned at a proper location after the substrate W is positioned on the transfer plate 1210.

The driving member 1270 feeds or transfers the transfer plate 1210. The driving member 1270 is provided to linearly move or vertically drive the transfer plate 1210.

The heating unit 1300 heats the substrate while supporting the substrate W. The heating unit 1300 includes a plate 1311, a pin hole 1312, a heater 1313, a lift pin 1315, a cover 1317, and a driver 1319.

The plate 1311 is provided to have a cylindrical shape. The plate 1311 may be formed of a material of an excellent thermal conductivity. As an example, the chamber 1311 may be formed of a metallic material. A pin hole 1312 accommodating the lift pin 1315 is formed on the plate 1311.

The heater 1313 heats the substrate W. The heater 1313 is provided in the interior of the plate 1311. For example, the heater 1313 may be a heating coil installed in the plate 1311. Unlike this, the plate 1311 may be provided with heating patterns. Because the heater 1313 is provided in the interior of the plate 1311, the plate 1311 is heated first before the substrate W is heated.

The pin hole 1312 is provided for a path through which the lift pin 1315 moves, when the lift pin 1315 moves the substrate W upwards and downwards. A plurality of pin holes 1312 may be provided on the plate 1311.

The lift pin 1315 is moved upwards and downwards by an elevation mechanism (not illustrated). The lift pin 1315 may seat the substrate W on the plate 1311. The lift pin 1315 may elevate the substrate W to a location that is spaced apart from the plate 1311 by a specific distance.

The cover 1317 is located on the plate 1311. The cover 1317 is provided to have a cylindrical shape. The cover 1317 provides a heating space in the interior thereof. When the substrate W is moved to the plate 1311, the cover 1317 is moved to the upper side of the plate 1311 by the driver 1319. When the substrate W is heated by the plate 1311, the cover 1317 is moved downwards by the driver 1319 to form a heating space in which the substrate W is heated.

The driver 1319 is fixedly coupled to the cover 1317 by a support 1318. The driver 1319 elevates the cover 1317 when the substrate W is fed or transferred to the plate 1311. As an example, the driver 1319 may be provided as a cylinder driver.

The cooling unit 1400 functions to cool the plate 1311 or the treated substrate W. The cooling unit 1400 is located in the interior of the housing 1100. The cooling unit 1400 is located closer to the first side wall 1111 than to the second side wall 1112. The cooling unit 400 includes a cooling plate 410.

The cooling plate 1410 cools the substrate W. The cooling plate 1410 may have a cylindrical shape. The cooling plate 1410 may have a size corresponding to the substrate W. A cooling passage may be provided in the interior of the cooling plate 1410. Cooling water may be supplied to the cooling passage to cool the substrate W. While the substrate W is maintained in the transfer plate 1210, the transfer plate 1210 may be positioned on the cooling plate 1410 and the substrate W may be cooled.

The controller 30 controls the process executing module 20 such that the first coating process S10, the etching process S30, and the second coating process S40 may be sequentially performed. The controller 30 controls the process executing module 20 such that a heat treatment process is performed between the first coating process S10 and the etching process S30, and after the second coating process S40. The controller 30 controls the rotation driving members 384 and 386 and the etching unit 940 or the rotation driving members 384 and the coating unit 920 such that the substrate W may be repeatedly rotated alternately at a first speed r1 and at a second speed r2 while the chemical or the coating liquid is supplied. The second speed r2 is a speed that is higher than the first speed r1.

Hereinafter, a method for treating a substrate by using the substrate treating system 1 of FIG. 1 according to an embodiment of the inventive concept will be described.

Figure 8:
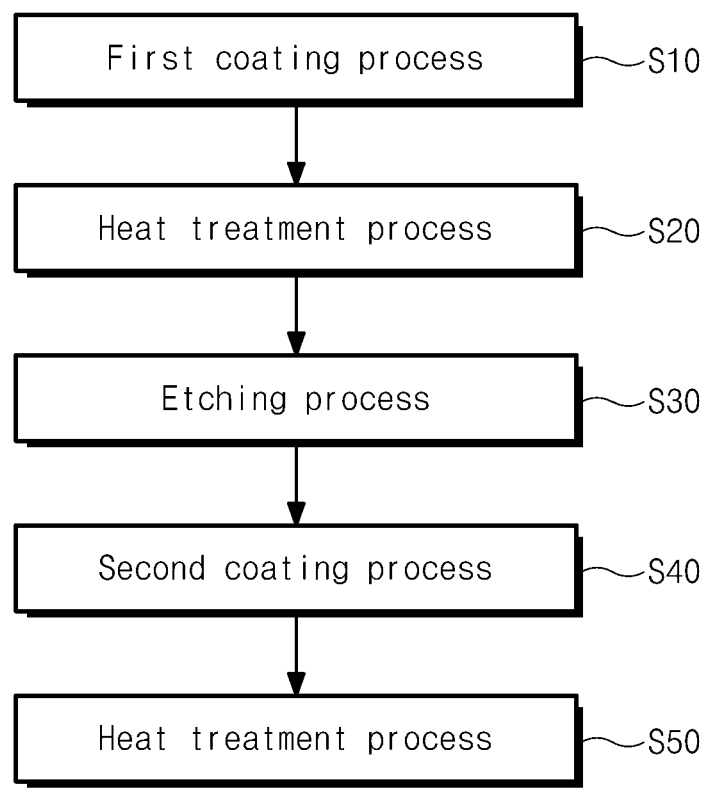
FIG. 8 is a flowchart illustrating a method for treating a substrate according to an embodiment of the inventive concept.

FIG. 8 is a flowchart illustrating a method for treating a substrate according to an embodiment of the inventive concept. Referring to FIG. 8, the substrate treating method includes a first coating process S10, an etching process S30, a second coating process S40, and heat treatment processes S20 and S50. The first coating process S10, the etching process S30, and the second coating process S40 may be sequentially performed.

Figure 9:
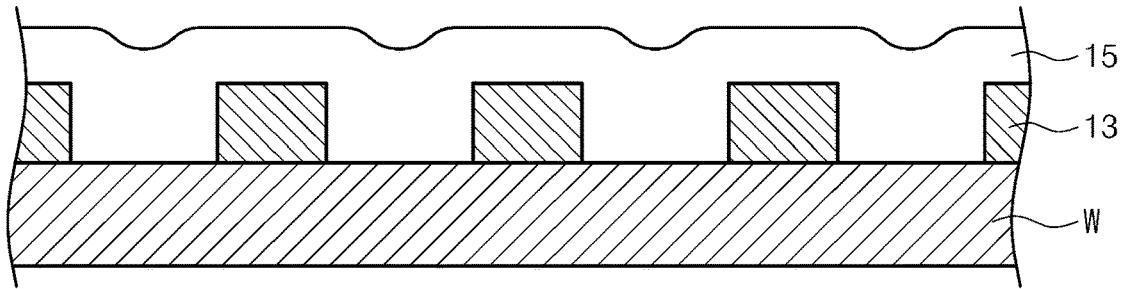
FIGS. 9 to 11 are sectional views illustrating a substrate on which a first coating process, an etching process, and a second coating process of FIG. 8 are performed.
Figure 10:
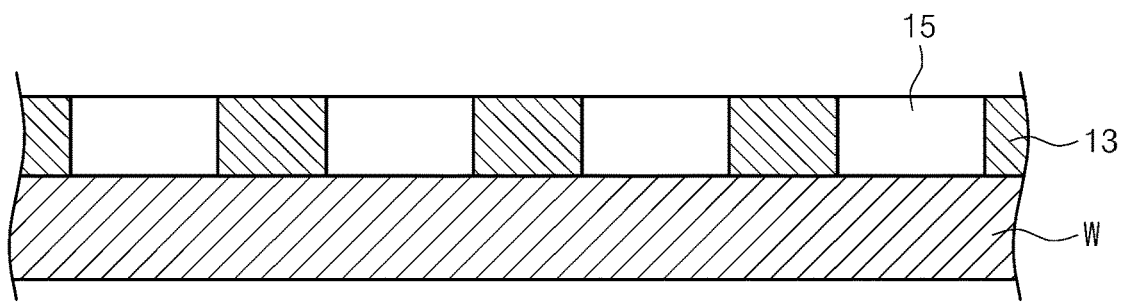
Figure 11:
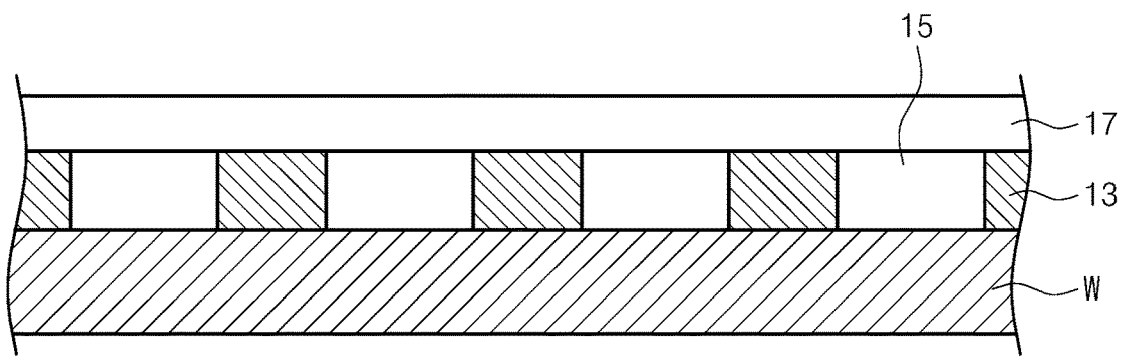

FIGS. 9 to 11 are sectional views illustrating a substrate W on which a first coating process S10, an etching process S30, and a second coating process S40 of FIG. 8 are performed. Referring to FIG. 9, in the first coating process S10, the controller 30 controls the first coating unit 920a and the substrate support unit 830 to perform the first coating process S10. In the first coating process S10, a first coating layer 15 is formed by supplying a first coating liquid onto the substrate W having a pattern 13 in the first chamber 260a. The first coating liquid is coated to concave portions between the patterns 13 and upper surfaces of the patterns 13 to form a first coating layer 15 on the concave portions between the patterns 13 and the upper surfaces of the patterns 13.

Referring to FIG. 10, in the etching process S30, the controller 30 controls the etching unit 940 and the substrate support unit 830 to perform the etching process S30 in the first chamber 260a or the second chamber 260b. In the etching process S30, the first coating layer 15 located on an upper surface of the pattern 13 is removed such that the upper surface of the pattern 13 is exposed, by supplying a chemical to the substrate W. The etching process S30 is performed on the entire upper surface of the substrate W.

Figure 12:
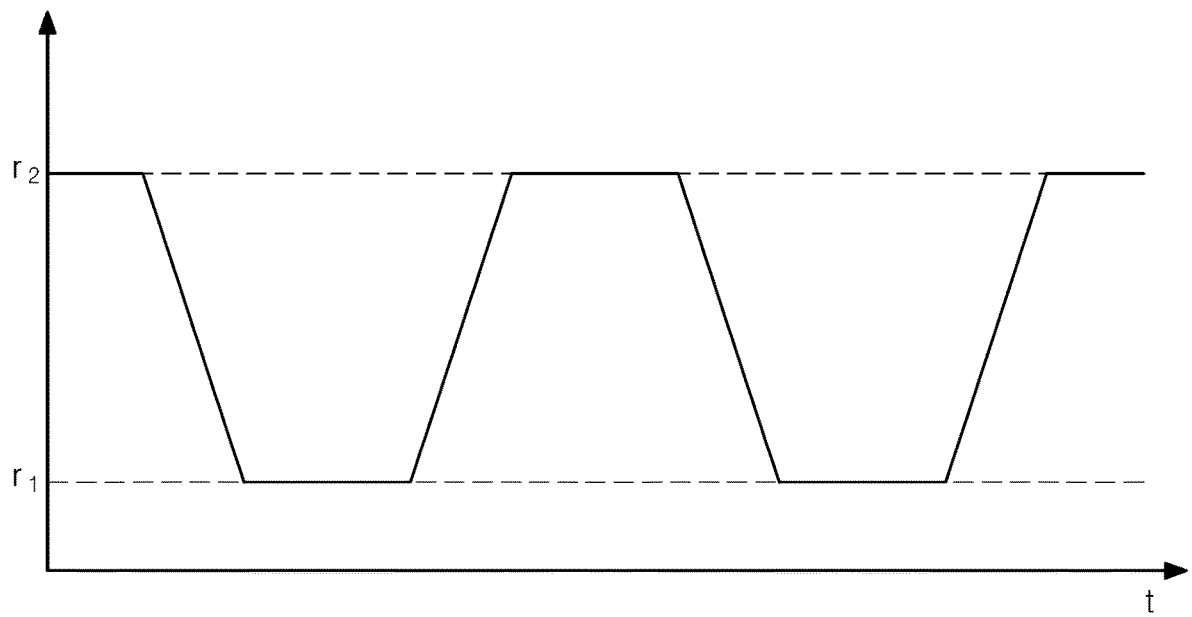
FIGS. 12 and 13 are graphs illustrating a rotational speed of a spin chuck according to embodiments of the inventive concept.
Figure 13:
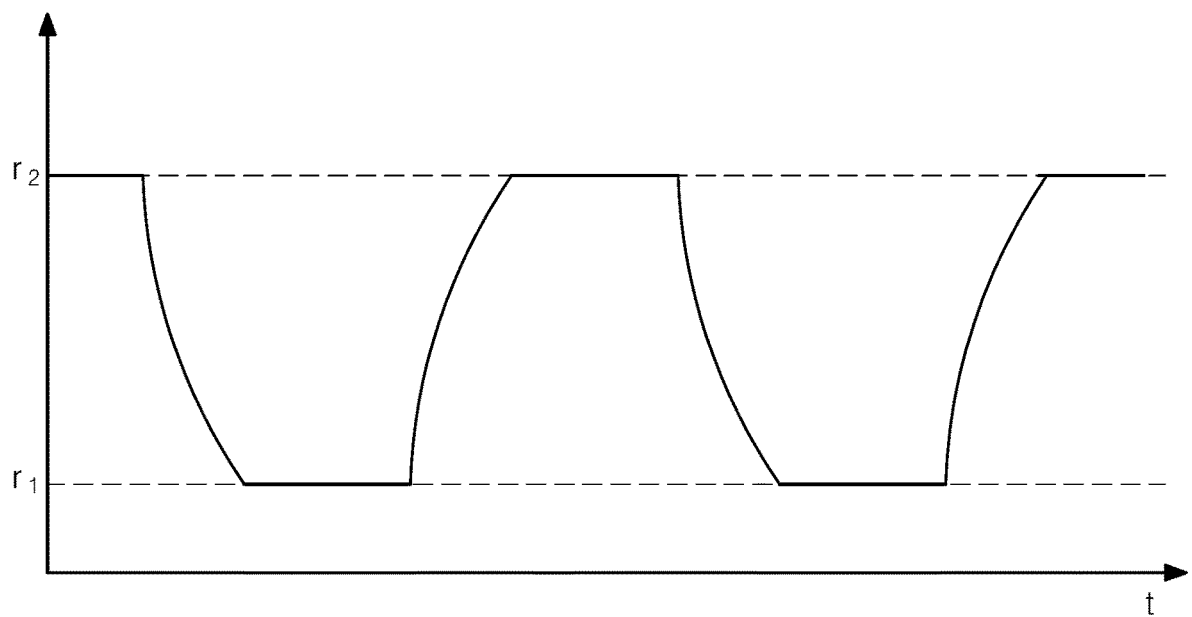

FIGS. 12 and 13 are graphs illustrating a rotational speed of a spin chuck 832 according to embodiments of the inventive concept. Referring to FIG. 12, according to an embodiment, the controller 30 controls the rotation driving members 384 and 386 and the etching unit 940 such that the substrate W positioned on the spin chuck 832 may be repeatedly rotated alternately at a first speed r1 and a second speed r2. The second speed r2 is a speed that is higher than the first speed r1. For example, the first speed r1 may be 100 rpm or lower, and the second speed r2 may be 1000 rpm or higher. Further, the first speed r1 may be zero, and the substrate W may not be rotated. Because a relatively low centrifugal force is applied when the substrate W is rotated at the first speed r1 while the chemical is supplied, the chemical may stay on the substrate W for a long time to sufficiently react an etching target. Further, because a relatively high centrifugal force is applied while the substrate W is rotated at the second speed r2, the chemical is diffused to the substrate W at a higher speed so that a time period for which the chemical is coated to the entire substrate is shortened. Further, the etched side-products causing particles by the strong centrifugal force are removed from the substrate W together with the chemical so that particles may be reduced.

The controller 30 may control the rotation driving members 384 and 386 and the etching unit 940 such that speed changes between the first speed r1 and the second speed r2 may be performed two times or more. The controller 30 may control the rotation driving members 384 and 386 and the etching unit 940 such that the initial rotation speed of the substrate W may be the first speed r1 or the second speed r2. The controller 30 may control the rotation driving members 384 and 386 and the etching unit 940 such that the rotational acceleration of the substrate W may be constant while the rotational speed of the substrate W is changed between the first speed r1 and the second speed r2.

Referring to FIG. 13, unlike the case of FIG. 12, the controller 30 may control the rotation driving members 384 and 386 and the etching unit 940 such that the rotational acceleration of the substrate W may be changed while the rotational speed of the substrate W is changed between the first speed r1 and the second speed r2. Specifically, the rotational acceleration of the substrate W may decrease during the etching process. A foregoing portion of the rotational acceleration in every change of rotational speed between first speed r1 and second speed r2 may be larger than a subsequent portion of the rotational acceleration.

Etching of a high selection ratio may be achieved as compared with dry etching by performing the etching process S30 in a wet method in which the chemical is supplied. When the substrate treating method of the inventive concept is performed by using the apparatus of FIG. 1, if the etching process S30 is performed in the first chamber 260a, the substrate W is carried into the first chamber 260a again for the etching process S30 after the first coating process S10 is completed and the substrate W is carried out of the first chamber 260a such that the heat treatment process S20 is performed in the bake chamber 280. Accordingly, because transfer of the substrate between the etching process S30 and the second coating process S40 is not required if the etching process S30 is performed in the second chamber 260b, the etching process S30 may be efficient as the entire process time is shortened as compared with the case in which the etching process S30 is performed in the second chamber S40.

Referring to FIG. 11, in the second coating process S40, the controller 30 controls the second coating unit 920b and the substrate support unit 830 to perform the second coating process S40. In the second coating process S40, a second coating layer 17 is formed by supplying a second coating liquid onto the substrate W in the second chamber 260b. The second coating liquid is coated such that the second coating layer 17 formed on the upper surface of the pattern 13 and the second coating layer 17 formed on the upper surface of the first coating layer 15 are levelled to each other.

In the heat treatment processes S20 and S50, the substrate W is heat-treated by heating the substrate W to a specific temperature. The heat treatment processes S20 and S50 are performed between the first coating process S10 and the etching process S30, and after the second coating process S40. A temperature at which the substrate W is heated in the heat treatment process S20 performed between the first coating process S10 and the etching process S30 and a temperature at which the substrate W is heated in the heat treatment process S50 performed after the second coating process S40 may be different. In order to shorten a transfer distance of the substrate W, the bake chamber 280 that performs the heat treatment process S20 performed between the first coating process S10 and the etching process S30 may be provided at a height corresponding to the first chamber 260a, and the bake chamber 280 that performs the heat treatment process S50 performed after the second coating process S40 may be provided at a height corresponding to the second chamber 260b.

It has been described that the method of supplying a liquid while changing the rotational speeds of the rotation driving members 384 and 386 is applied to the etching process. However, unlike this, the method of supplying a liquid while changing the rotational speeds of the rotation driving members 384 and 386 of the inventive concept may be applied to various types of substrate treating processes of supplying a liquid while rotating the substrate W, such as the first coating process or the second coating process.

As described above, in the apparatus and the method according to the embodiment of the inventive concept, a speed at which the treatment liquid is diffused onto the substrate may be increased at a high speed state, for the same amount of supplied treatment liquid, by changing the rotational speed of the substrate while the treatment liquid is supplied to the substrate W, the treatment side-products may be easily removed from the substrate W, and the treatment efficiency of the substrate W may be increased by sufficiently providing a reaction time of the treatment liquid and a treatment target material on the substrate W at a low speed. Accordingly, the apparatus and the method of the inventive concept may increase the treatment efficiency of the substrate and reduce the amount of used treatment liquid.

According to an embodiment of the inventive concept, the apparatus and the method of the inventive concept may increase treatment efficiency.

According to an embodiment of the inventive concept, the apparatus and the method of the inventive concept may reduce the amount of used treatment liquid.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate by supplying a treatment liquid onto the substrate during an etching process, the method consists of:
   repeatedly rotating the substrate alternately at a first speed and at a second speed while the treatment liquid is supplied,
   wherein the second speed is higher than the first speed,
   wherein the supply of the treatment liquid is initiated when the substrate rotates at the second speed,
   wherein the treatment liquid is a chemical for etching a film coated on the substrate,
   wherein a rotational acceleration of the substrate is changed while the rotational speed of the substrate is changed between the first speed and the second speed, and
   wherein a foregoing portion of the rotational acceleration is larger than a subsequent portion of the rotational acceleration during the change of the rotational acceleration.

2. The method of claim 1, wherein the rotational speed of the substrate is changed between the first speed and the second speed two times or more.

3. The method of claim 1, wherein the first speed is 100 rpm or lower and the second speed is 1000 rpm or higher.

4. The method of claim 3, wherein the second speed is higher than 1000 rpm.

5. The method of claim 1, wherein the first speed is 0 rpm.

6. The method of claim 1, wherein the treatment liquid includes thinner.

7. The method of claim 1, wherein a time period for which the treatment liquid is supplied is 100 seconds or less.

8. A method for treating a substrate, the method comprising:
   a first coating process of forming a first coating layer by supplying a first coating liquid onto the substrate having a pattern, in a first chamber;
   an etching process of removing the first coating layer located on an upper surface of the pattern such that the upper surface of the pattern is exposed, by supplying a chemical onto the substrate; and
   a second coating process of forming a second coating layer by supplying a second coating liquid onto the substrate having a pattern, in a second chamber,
   wherein the first coating process, the etching process, and the second coating process are sequentially performed,
   wherein the etching process consists of:
   repeatedly rotating the substrate alternately at a first speed and at a second speed while the treatment liquid is supplied,
   wherein the second speed is higher than the first speed,
   wherein the supply of the chemical is initiated when the substrate rotates at the second speed,
   wherein a rotational acceleration of the substrate is changed while the rotational speed of the substrate is changed between the first speed and the second speed, and
   wherein a foregoing portion of the rotational acceleration is larger than a subsequent portion of the rotational acceleration during the change of the rotational acceleration.

9. The method of claim 8, wherein the rotational speed of the substrate is changed between the first speed and the second speed two times or more.

10. The method of claim 8, wherein the first speed is 100 rpm or lower and the second speed is 1000 rpm or higher.

11. The method of claim 8,
    wherein the chemical being provided for etching the first coating layer, and
    wherein the first speed is 100 rpm or lower and the second speed is higher than 1000 rpm.

12. The method of claim 8, wherein the etching process is performed in one of the first chamber or the second chamber.

* * * * *